US011587742B1

(12) United States Patent
Thompson et al.

(10) Patent No.: US 11,587,742 B1
(45) Date of Patent: Feb. 21, 2023

(54) INGRESS-TOLERANT INPUT DEVICES

(71) Applicant: Medtronic MiniMed, Inc., Northridge, CA (US)

(72) Inventors: Chase A. Thompson, Sylmar, CA (US); Adam S. Trock, Simi Valley, CA (US)

(73) Assignee: MEDTRONIC MINIMED, INC., Northridge (CA)

( * ) Notice: Subject to any disclaimer, the term of this patent is extended or adjusted under 35 U.S.C. 154(b) by 0 days.

(21) Appl. No.: 17/465,708

(22) Filed: Sep. 2, 2021

(51) Int. Cl.
*H01H 9/04* (2006.01)
*H01H 1/54* (2006.01)
*H01H 3/12* (2006.01)

(52) U.S. Cl.
CPC ................ *H01H 9/04* (2013.01); *H01H 1/54* (2013.01); *H01H 3/12* (2013.01)

(58) Field of Classification Search
CPC .. H01H 9/04; H01H 1/54; H01H 3/12; G16H 20/17; A61M 5/172
USPC ............................................ 200/302.1, 302.2
See application file for complete search history.

(56) References Cited

U.S. PATENT DOCUMENTS 4,438,305 A * 3/1984 Johnson ................. H01H 35/34 200/82 C
4,755,173 A 7/1988 Konopka et al.
5,391,250 A 2/1995 Cheney, II et al.
5,485,408 A 1/1996 Blomquist
5,522,803 A 6/1996 Teissen-Simony
5,665,065 A 9/1997 Colman et al.
5,800,420 A 9/1998 Grass et al.
5,807,375 A 9/1998 Grass et al.
5,925,021 A 7/1999 Castellano et al.
5,954,643 A 9/1999 Van Antwerp et al.
6,007,377 A * 12/1999 Cook ...................... H01H 9/04 174/77 R
6,017,328 A 1/2000 Fischell et al.
6,186,982 B1 2/2001 Gross et al.
6,246,992 B1 6/2001 Brown
6,248,067 B1 6/2001 Causey, III et al.
6,248,093 B1 6/2001 Moberg
6,355,021 B1 3/2002 Nielsen et al.
6,379,301 B1 4/2002 Worthington et al.
6,544,212 B2 4/2003 Galley et al.
6,558,351 B1 5/2003 Steil et al.
6,591,876 B2 7/2003 Safabash
6,641,533 B2 11/2003 Causey, III et al.
6,736,797 B1 5/2004 Larsen et al.
6,749,587 B2 6/2004 Flaherty
6,766,183 B2 7/2004 Walsh et al.
(Continued)

*Primary Examiner* — Edwin A. Leon
*Assistant Examiner* — Iman Malakooti
(74) *Attorney, Agent, or Firm* — Shumaker & Sieffert, P.A.

(57) ABSTRACT

This disclosure relates to ingress-tolerant input devices. Aspects of the disclosure relate to an ingress-tolerant switch assembly for operating an electronic device in an ingress-protected manner. The switch assembly includes a button configured to be coupled to an outer surface of an enclosure of the electronic device. The switch assembly also includes a spring operably coupled to the button and a magnet coupled to the spring. A pressing force applied by a user to the button overcomes a spring force of the spring to move the magnet into proximity of the magnetic sensor to cause the magnetic sensor to generate a sensor signal for performing a function of the electronic device.

20 Claims, 2 Drawing Sheets

(56) References Cited

U.S. PATENT DOCUMENTS

| | | | |
|---|---|---|---|
| 6,801,420 B2 | 10/2004 | Talbot et al. | |
| 6,804,544 B2 | 10/2004 | Van Antwerp et al. | |
| 7,003,336 B2 | 2/2006 | Holker et al. | |
| 7,029,444 B2 | 4/2006 | Shin et al. | |
| 7,066,909 B1 | 6/2006 | Peter et al. | |
| 7,137,964 B2 | 11/2006 | Flaherty | |
| 7,303,549 B2 | 12/2007 | Flaherty et al. | |
| 7,399,277 B2 | 7/2008 | Saidara et al. | |
| 7,442,186 B2 | 10/2008 | Blomquist | |
| 7,602,310 B2 | 10/2009 | Mann et al. | |
| 7,647,237 B2 | 1/2010 | Malave et al. | |
| 7,699,807 B2 | 4/2010 | Faust et al. | |
| 7,727,148 B2 | 6/2010 | Talbot et al. | |
| 7,785,313 B2 | 8/2010 | Mastrototaro | |
| 7,806,886 B2 | 10/2010 | Kanderian, Jr. et al. | |
| 7,819,843 B2 | 10/2010 | Mann et al. | |
| 7,828,764 B2 | 11/2010 | Moberg et al. | |
| 7,879,010 B2 | 2/2011 | Nunn et al. | |
| 7,890,295 B2 | 2/2011 | Shin et al. | |
| 7,892,206 B2 | 2/2011 | Moberg et al. | |
| 7,892,748 B2 | 2/2011 | Norrild et al. | |
| 7,901,394 B2 | 3/2011 | Ireland et al. | |
| 7,942,844 B2 | 5/2011 | Moberg et al. | |
| 7,946,985 B2 | 5/2011 | Mastrototaro et al. | |
| 7,955,305 B2 | 6/2011 | Moberg et al. | |
| 7,963,954 B2 | 6/2011 | Kavazov | |
| 7,977,112 B2 | 7/2011 | Burke et al. | |
| 7,979,259 B2 | 7/2011 | Brown | |
| 7,985,330 B2 | 7/2011 | Wang et al. | |
| 8,024,201 B2 | 9/2011 | Brown | |
| 8,100,852 B2 | 1/2012 | Moberg et al. | |
| 8,114,268 B2 | 2/2012 | Wang et al. | |
| 8,114,269 B2 | 2/2012 | Cooper et al. | |
| 8,137,314 B2 | 3/2012 | Mounce et al. | |
| 8,181,849 B2 | 5/2012 | Bazargan et al. | |
| 8,182,462 B2 | 5/2012 | Istoc et al. | |
| 8,192,395 B2 | 6/2012 | Estes et al. | |
| 8,195,265 B2 | 6/2012 | Goode, Jr. et al. | |
| 8,202,250 B2 | 6/2012 | Stutz, Jr. | |
| 8,207,859 B2 | 6/2012 | Enegren et al. | |
| 8,226,615 B2 | 7/2012 | Bikovsky | |
| 8,257,259 B2 | 9/2012 | Brauker et al. | |
| 8,267,921 B2 | 9/2012 | Yodfat et al. | |
| 8,275,437 B2 | 9/2012 | Brauker et al. | |
| 8,277,415 B2 | 10/2012 | Mounce et al. | |
| 8,292,849 B2 | 10/2012 | Bobroff et al. | |
| 8,298,172 B2 | 10/2012 | Nielsen et al. | |
| 8,303,572 B2 | 11/2012 | Mair et al. | |
| 8,305,580 B2 | 11/2012 | Aasmul | |
| 8,308,679 B2 | 11/2012 | Hanson et al. | |
| 8,313,433 B2 | 11/2012 | Cohen et al. | |
| 8,318,443 B2 | 11/2012 | Norrild et al. | |
| 8,323,250 B2 | 12/2012 | Chong et al. | |
| 8,343,092 B2 | 1/2013 | Rush et al. | |
| 8,352,011 B2 | 1/2013 | Van Antwerp et al. | |
| 8,353,829 B2 | 1/2013 | Say et al. | |
| 9,672,328 B2 | 6/2017 | Saint et al. | |
| 10,835,727 B2 | 11/2020 | Montalvo et al. | |
| 2007/0123819 A1 | 5/2007 | Mernoe et al. | |
| 2010/0160861 A1 | 6/2010 | Causey, III et al. | |
| 2011/0160654 A1* | 6/2011 | Hanson | A61M 5/1684 340/603 |
| 2016/0015887 A1* | 1/2016 | Pananen | A61M 5/5086 604/111 |
| 2020/0327973 A1 | 10/2020 | Pryor et al. | |

* cited by examiner

INGRESS-TOLERANT INPUT DEVICES

TECHNICAL FIELD

This disclosure relates generally to input devices, and more particularly, to ingress-tolerant input devices.

BACKGROUND

Many electronic devices include a watertight housing or enclosure to protect the internal mechanisms and electronics from the damaging effects of water. The Ingress Protection Code (IP Code) is published by the International Electrotechnical Commission (IEC) to classify and rate the degree of protection provided by mechanical casings and electrical enclosures against intrusion, dust, accidental contact, and water. For example, the "8" in "IPX8" indicates the level of protection that mechanical casings and electrical enclosures provide against the ingress of water. More specifically, devices having the "IPX8" rating are capable of being immersed in more than 1 meter of water without harmful effects. Water ingress may be of particular concern with certain types of medical devices, such as portable medical devices that are subject to a variety of environmental conditions.

SUMMARY

The disclosure relates to ingress-tolerant input devices. Aspects of the disclosure relate to an ingress-tolerant switch assembly for operating an electronic device in an ingress-protected manner. The switch assembly includes a button configured to be coupled to an outer surface of an enclosure of the electronic device. The switch assembly also includes a spring operably coupled to the button and a magnet coupled to the spring. A spring force of the spring is overcome by a pressing force applied by a user to the button such that the spring moves the magnet into proximity of the magnetic sensor to cause the magnetic sensor to generate a sensor signal for performing a function of the electronic device.

BRIEF DESCRIPTION OF THE DRAWINGS

The above and other aspects and features of the disclosure will become more apparent in view of the following detailed description when taken in conjunction with the accompanying drawings wherein like reference numerals identify similar or identical elements.

DETAILED DESCRIPTION

Figure 1:
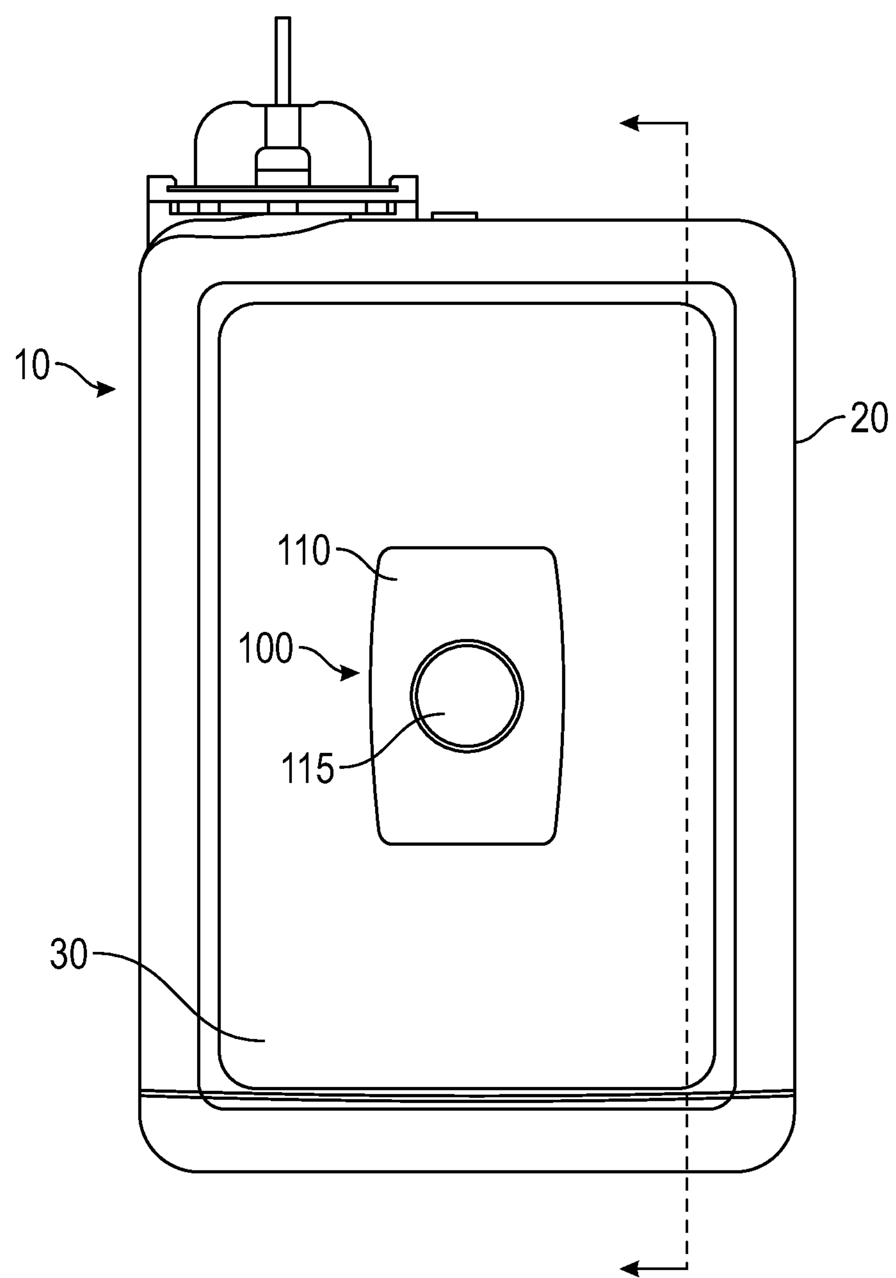
FIG. 1 is a diagram of an exemplary ingress-protected electronic device having an ingress-tolerant switch assembly, in accordance with aspects of the disclosure.

The disclosure relates to ingress-tolerant input devices.

It is desirable for portable electronic devices to have protection against the ingress of harmful elements, particularly water. However, the various moving parts involved in user input devices (e.g., buttons or switches) can pose challenges for ingress protection. For example, a keypad and its electronics may be physically bonded over an opening in the housing of a portable device, and a plastic overlay material may create a watertight seal over the keypad and the device housing. Tight tolerances of mating components help ensure proper compression is maintained, but elastomers typically weaken over time, thereby decreasing compression and creating a risk of water ingress.

To avoid the aforementioned shortcomings, disclosed herein is an ingress-tolerant switch assembly that is operatively connected to the ingress-protected housing of an electronic device. The switch assembly may be ingress-tolerant in that it includes components that remain unaffected by water ingress. For examples, components of the switch assembly may be made of corrosion-resistant materials, such as ferromagnetic metal alloys. In contrast, the electronic device may have a watertight housing that is free of any mechanical or electrical interfaces. Thus, the switch assembly is configured to communicate indirectly (e.g., electromagnetically) with the internal electronics of the electronic device. For example, the switch assembly may include a magnet, and the electronic device may include a magnetic sensor configured to determine the magnet's position based on electromagnetic fields passing through the electronic device housing.

Although the disclosure may be described primarily with respect to electronic medical devices such as insulin delivery systems, the scope of the disclosure is not limited to electronic medical devices. Rather, the disclosure applies to and can be implemented with any suitable electronic device for which water ingress is a concern. It is intended that any aspect, embodiment, and description relating to electronic medical devices shall be applicable to any other types of electronic devices where water ingress is a concern.

Although the disclosure is not limited in this regard, discussions utilizing terms such as, for example, "processing," "computing," "calculating," "determining," "establishing," "analyzing," "checking," or the like, may refer to operation(s) and/or process(es) of a computer, a computing platform, a computing system, or other electronic computing device that manipulates and/or transforms data represented as physical (e.g., electronic) quantities within the device's registers and/or memories into other data similarly represented as physical quantities within the device's registers and/or memories. As used herein, "memories" may refer to volatile and/or non-volatile memory devices, including non-transitory information storage media that may store instructions for performing operations and/or processes. As used herein, "exemplary" does not necessarily mean "preferred" and may simply refer to an example unless the context clearly indicates otherwise.

Referring to FIG. 1, there is shown an exemplary ingress-protected electronic device referred to generally by the reference numeral 10. The electronic device 10 generally includes an ingress-protected enclosure 20 and a switch assembly 100 coupled to an outer surface 30 of the enclosure 20. The switch assembly 100 is configured to be manipulated to control functionality of the electronic device 10. The electronic device 10 may be, for example, a medicine delivery device configured to be secured to the body or clothing of a person for delivering a therapeutic substance (e.g., insulin) to the person. In this example, the switch assembly 100 may serve to effect various functionalities of the medicine delivery device such as, for example, medicine administration, adjustment of therapy settings, changing of user preferences, or the like.

Figure 2:
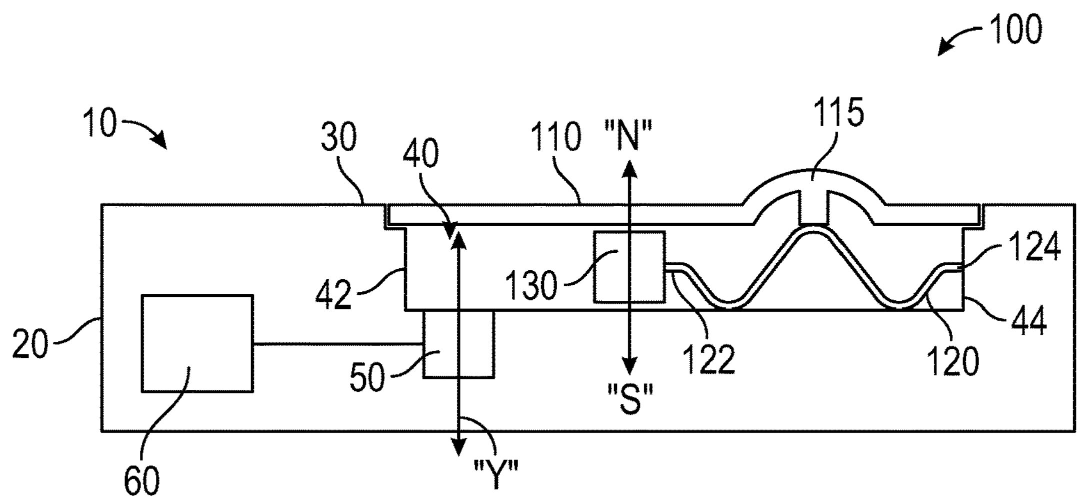
FIG. 2 is a cross-sectional view of the electronic device of FIG. 1 illustrating components of the electronic device and showing the switch assembly in a first configuration, in accordance with aspects of the disclosure.

Referring to FIG. 2, a cross-sectional view of the electronic device 10 is shown and illustrates the switch assembly 100 disposed within a recessed portion 40 defined by the outer surface 30 of the enclosure 20. The switch assembly 100 generally includes a button interface 110 overlaying the recessed portion 40 from a first end 42 of the recessed portion 40 to a second end 44 of the recessed portion 40 to enclose a spring 120 and a magnet 130 within the recessed portion 40.

The button interface 110 may be made from a flexible material (e.g., flexible plastic, rubber, silicone, or the like) that is also used to form a button 115 that is configured to be depressed (e.g., in response to a force imparted by a person's fingertip) toward the recessed portion 40 to communicate a command to the electronic device 10, as described in more detail below.

In some embodiments, the button 115 may be a spring-loaded push button for a momentary or latching switch. The button 115 can stay in a first position when not pressed, move to a second position closer to the enclosure 20 when pressed, and return to the first position when it is pushed again or when a pressing force is removed. In embodiments, depression of the button 115 may create air pressure within the recessed portion 40, which serves to expel any fluids such as water that may have entered the recessed portion 40. For example, since the switch assembly 100 of the disclosure does not necessarily require ingress protection, the interface between the button interface 110 and the outer surface 30 of the enclosure 20 may not be watertight. Thus, fluid such as water may be expelled from the recessed portion 40 along the perimeter joint of the button interface 110 and the enclosure 20. Additionally or alternatively, the button interface 110 may include an aperture (not shown) configured to serve as an egress for fluid from the recessed portion 40 of the enclosure 20.

As illustrated in FIG. 2, the button interface 110 may be positioned within the recessed portion 40 of the enclosure 20 such that an outer surface of the button interface 110 is generally flush with an outer periphery of the enclosure 20 and the button 115 protrudes at least partially outward from the outer periphery of the enclosure 20. The spring 120 may be any suitable type of spring (e.g., a flat spring, a coil spring, a leaf spring, or the like) and may be made from a material that is resistant to the damaging or corrosive effects of water exposure such as, for example, metal (e.g., stainless steel) or plastic. The spring 120 has a first end 122 coupled to the magnet 130 and a second end 124, opposite the first end 122, that is configured to abut the second end 44 of the recessed portion 40.

The magnet 130 may be permanently or releasably coupled to the first end 122 of the spring 120 using any standard mechanical coupling interface (e.g., welding, adhesive, overmolding, latch, etc.). The magnet 130 may also be corrosion resistant and/or include a shell casing that is corrosion resistant. The magnet 130 may be a standard permanent magnet that produces its own magnetic field and has two poles, a north "N" pole and a south "S" pole, as would be understood by persons skilled in the art, and as depicted in FIG. 2.

Figure 3:
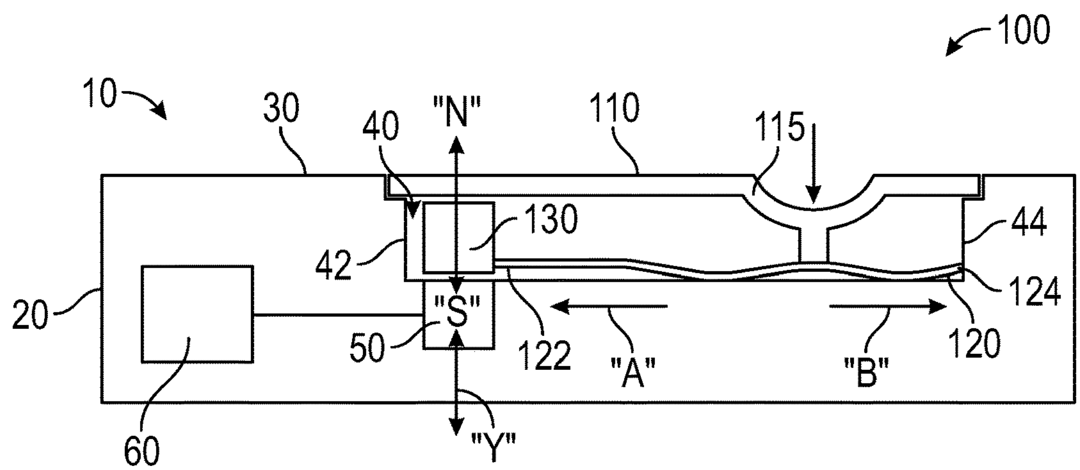
FIG. 3 is a cross-sectional view of the electronic device of FIG. 1 illustrating the switch assembly in a second configuration, in accordance with aspects of the disclosure.
Figure 4:
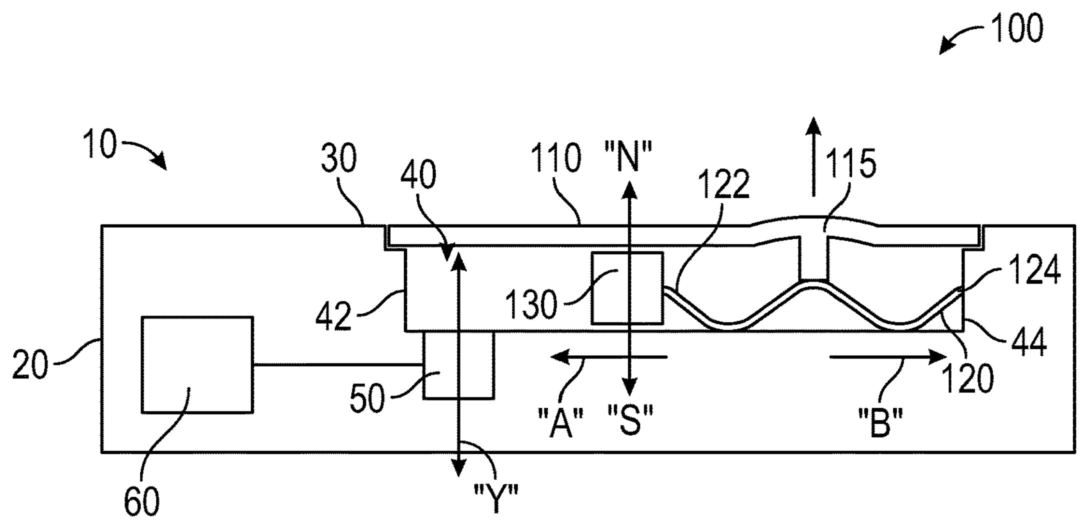
FIG. 4 is a cross-sectional view of the electronic device of FIG. 1 illustrating the switch assembly returning from the second configuration to the first configuration, in accordance with aspects of the disclosure.

At least a portion of the spring 120 is in close proximity to the button 115 such that depression of the button 115 toward the enclosure 20 imparts a force on the spring 120 sufficient to overcome the spring force or constant of the spring 120 and to transition the spring 120 from a normal unstressed configuration, as shown in FIG. 2, to a stressed configuration as shown in FIG. 3. In embodiments, the spring 120 has a first longitudinal length when in the unstressed configuration and has a second longitudinal length when in the stressed configuration that is greater than the first length. More specifically, as the spring force of the spring 120 is overcome by the pressing force applied by a user to depress the button 115, the spring 120 applies opposing forces in the directions indicated by directional arrows "A" and "B" in FIG. 3, which are proportional to the pressing force applied to the button 115. The first end 122 of the spring 120 is forced to move in the direction indicated by directional arrow "A" in FIG. 3. Since the second end 124 of the spring 120 abuts the second end 44 of the recessed portion 40, the spring 120 applies a force in the "B" direction on the second end 44 of the recessed portion 40 and the second end 124 of the spring 120, but is prevented from movement in the "B" direction. Movement of the first end 122 of the spring 120 in the "A" direction correspondingly moves the magnet 130 in the "A" direction toward the first end 42 of the recessed portion 40. In some embodiments, the first end 122 of the spring 120 moves in a direction (e.g., direction "A") that is perpendicular to the direction of the pressing force applied to the button 115. As shown in FIG. 4, when the button 115 is no longer depressed (e.g., a pressing force on the button 115 is removed), the restoring force of the spring 120 returns the spring 120 to its normal unstressed configuration, thereby urging the first end 122 of the spring 120 in the "B" direction, which also urges the magnet 130 in the "B" direction, and back to a home position.

Disposed within the enclosure 20 of the electronic device 10 are a magnetic sensor 50 and processing circuitry 60 in communication with the magnetic sensor 50. The processing circuitry 60 is configured to receive and process sensor signals from the magnetic sensor 50. The processing circuitry 60 may include various types of logic circuitry, including, but not limited to, microprocessors, controllers, digital signal processors (DSPs), application specific integrated circuits (ASICs), field-programmable gate arrays (FPGAs), central processing units (CPU), graphics processing units (GPU), programmable logic devices, memory (e.g., random access memory, volatile memory, non-volatile memory, etc.), or other discrete or integrated logic circuitry, as well as combinations of such components. The term "processing circuitry" may generally refer to any of the foregoing logic circuitry, alone or in combination with other logic circuitry, or any other circuitry for performing computations.

The magnetic sensor 50 is arranged inside the enclosure 20 in close proximity to the first end portion 42 of the recessed portion 40 and is configured to detect a presence or an absence of the magnetic field produced by the magnet 130. In this way, the magnetic sensor 50 may serve as a proximity sensor that detects whether the magnet 130 is within a predetermined distance from the magnetic sensor 50. When the spring 120 is in its normal unstressed configuration, as shown in FIG. 2, the magnet 130 is sufficiently distanced from the magnetic sensor 50 so that the presence of the magnet 130 is not detectable by the magnetic sensor 50. As the spring transitions from its normal unstressed configuration to its stressed configuration, as shown in FIG. 3, the magnet 130 moves closer to the magnetic sensor 50. When the magnet 130 is moved to within a sufficient proximity to the magnetic sensor 50 (e.g., within a predetermined distance), the magnetic sensor 50 detects the presence of the magnet 130 and/or magnetic field of the magnet 130 (as depicted by magnetic north pole "N" and south pole "S"), and generates a sensor signal that is received and processed by the processing circuitry 60.

In embodiments, the magnetic sensor 50 may be any standard magnetic sensor that is configured to detect the magnitude of magnetism generated by a magnetic material, examples of which include, but are not limited to, a Hall Effect sensor that varies its output voltage in response to changes in magnetic flux, a MEMS magnetic field sensor, a magnetic reed switch, or the like. The sensors described above are exemplary. Other sensors or types of sensors for detecting magnetic properties, among other things, will be recognized by persons skilled in the art and are contemplated to be within the scope of the disclosure. For any sensor, the signal provided by a sensor shall be referred to as a "sensor signal."

In an example implementing the magnetic sensor 50 as a Hall Effect sensor, when the button 115 is depressed, the magnet 130 is urged to move in the "A" direction toward the first end 42 of the recessed portion 40 into proximity of the magnetic sensor 50, as shown in FIG. 3. As described above, movement of the magnet 130 in the "A" direction is caused by transition of the spring 120 from its normal unstressed configuration (FIG. 2) to its stressed configuration (FIG. 3). As the magnet 130 moves closer to the magnetic sensor 50, the Hall Effect voltage in the magnetic sensor 50 changes due to the approaching proximity of the magnetic field of the magnet 130. This change in Hall Effect voltage is communicated as a sensor signal to the processing circuitry 60, which effects performance or termination of performance of a function related to the operation of the electronic device 10. In some embodiments, the magnetic sensor 50 may be configured such that the magnet 130 and/or the north "N" pole or the south "S" pole of the magnet 130 must be generally aligned with the magnetic sensor 50 or aligned (e.g., an axis of the poles "N" and "S" of the magnet 130 are parallel and substantially co-linear with a sensing axis "Y" of the magnetic sensor 50) with at least a portion of the magnetic sensor 50 before the magnetic sensor 50 communicates a sensor signal to the processing circuitry 60. In this manner, the magnetic sensor 50 may avoid inadvertently generating multiple sensor signals and/or erroneous sensor signals caused by, for example, less than complete actuation of the button 115, weak detection of the presence of the magnet 130, slow movement of the magnet 130 toward or away from the magnetic sensor 50, etc.

When the magnet 130 moves in the "B" direction away from the magnetic sensor 50 (and the axis of the poles "N" and "S" of the magnet 130 are moved out of alignment or co-linearity with the sensing axis "Y" of the magnetic sensor 50), the Hall Effect voltage changes back to its original state. In some embodiments, this change in Hall Effect voltage may be communicated as a sensor signal to the processing circuitry 60 to effect performance or termination of performance of a function related to the operation of the electronic device 10. As described above, movement of the magnet 130 in the "B" direction is caused by the restoring force of the spring 120 transitioning the spring 120 from its stressed configuration (FIG. 3) back to its normal unstressed configuration (FIG. 2) when a pressing force on the button 115 is removed (FIG. 4).

Depending on the type of magnetic sensor implemented, the thickness of the walls of the enclosure 20 may be made thinner or thicker to affect the sensitivity of the magnetic sensor 50 with respect to the magnet 130. In some embodiments, the magnetic sensor 50 may be disposed on a printed circuit board (not shown) that is in communication with the processing circuitry 60 and secured to an inner surface of the enclosure 20 in proximity to the recessed portion 40.

In some embodiments, the north "N" and south "S" poles of the magnet 130 move along an axis that is parallel to the surface of the magnetic sensor 50 that faces the recessed portion 40, as shown in FIGS. 2-4. In some embodiments, the magnetic sensor 50 may be disposed in proximity to the first end portion 42 of the recessed portion 40 such that the north "N" and south "S" poles of the magnet 130 move along an axis that is perpendicular to the surface of the magnetic sensor 50 that faces the magnet 130. Stated differently, the magnetic sensor 50 may be disposed along a side wall of the recessed portion 40 instead of along the bottom wall as depicted in FIGS. 2-4, and the north "N" and south "S" poles of the magnet 130 may run parallel to the axis of movement of the spring 120.

The embodiments disclosed herein are examples of the claimed subject matter, which be embodied in various forms. For instance, although certain embodiments herein are separately described, it should be appreciated that each of the embodiments herein may be combined with one or more of the other embodiments described herein. Specific structural and functional details disclosed herein are not to be interpreted as limiting, but as a basis for the claims and as a representative basis for teaching one skilled in the art to variously employ the disclosure in virtually any appropriately detailed structure. Like reference numerals may refer to similar or identical elements throughout the description of the figures.

The phrases "in an embodiment," "in embodiments," "in various embodiments," "in some embodiments," or "in other embodiments" may each refer to one or more of the same or different embodiments in accordance with the disclosure. A phrase in the form "A or B" means "(A), (B), or (A and B)." A phrase in the form "at least one of A, B, or C" means "(A); (B); (C); (A and B); (A and C); (B and C); or (A, B, and C)."

It should be understood that the foregoing description is only illustrative of the disclosure. To the extent consistent, any or all of the aspects detailed herein may be used in conjunction with any or all of the other aspects detailed herein. Various alternatives and modifications can be devised by those skilled in the art without departing from the disclosure. Accordingly, the disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. An ingress-tolerant switch assembly for operating an electronic device in an ingress-protected manner, the switch assembly comprising:

a button;

a spring operably coupled to the button, the spring configured to transition between an unstressed configuration and a stressed configuration in response to an actuation of the button; and a magnet coupled to the spring and configured to move, in response to transition of the spring between the unstressed configuration and the stressed configuration caused by the actuation of the button, into proximity of a magnetic sensor disposed within an ingress-protected enclosure defined by the electronic device, wherein the ingress-tolerant switch assembly is configured to be supported by the electronic device outside of the ingress-protected enclosure.

2. The switch assembly of claim 1, wherein the magnetic sensor is a Hall Effect sensor or a magnetic reed switch.

3. The switch assembly of claim 1, wherein the magnet includes a north pole and a south pole, and wherein the magnetic sensor is configured to generate a sensor signal in response to the north pole or the south pole of the magnet being aligned with at least a portion of the magnetic sensor.

4. The switch assembly of claim 1, wherein the electronic device is a medicine delivery device.

5. The switch assembly of claim 1, wherein the spring has a first end and an opposite second end, wherein the first end is coupled to the magnet and the second end is coupled to an outer surface of the electronic device outside of the ingress-protected enclosure, and wherein the actuation of the button causes the second end to apply a force in a first direction on the outer surface and causes the first end to move in a second direction opposite to the first direction.

6. The switch assembly of claim 1, wherein the spring is formed of a corrosion resistant material.

7. The switch assembly of claim 1, wherein the button is formed of an elastic material selected from the group consisting of silicone, rubber, and plastic.

8. The switch assembly of claim 1, wherein the spring and the magnet are configured to be disposed within a recessed portion defined by the electronic device outside of the ingress-protected enclosure.

9. The switch assembly of claim 8, wherein the button is configured to be depressed into the recessed portion.

10. The switch assembly of claim 1, wherein the spring is configured such that a restoring force of the spring returns the spring to the unstressed configuration to move the magnet out of proximity of the magnetic sensor.

11. The switch assembly of claim 1, further comprising the magnetic sensor, wherein the magnetic sensor is a MEMS magnetic field sensor.

12. An ingress-protected electronic device, comprising:

an ingress-protected housing defining an ingress-protected enclosure;

a magnetic sensor disposed within the ingress-protected enclosure; and an ingress-tolerant switch assembly disposed outside of the ingress-protected enclosure and coupled to the ingress-protected housing, the switch assembly including:

a button;

a spring operably coupled to the button, the spring configured to transition between an unstressed configuration and a stressed configuration in response to an actuation of the button; and a magnet coupled to the spring and configured to move into proximity of the magnetic sensor in response to transition of the spring between the unstressed configuration and the stressed configuration caused by the actuation of the button, wherein the magnetic sensor is configured to communicate a sensor signal to processing circuitry disposed within the ingress-protected enclosure when the magnet moves into proximity of the magnetic sensor to cause performance of a function of the ingress-protected electronic device.

13. The ingress protected electronic device of claim 12, wherein the magnetic sensor is a Hall Effect sensor or a magnetic reed switch.

14. The ingress protected electronic device of claim 12, wherein the magnet includes a north pole and a south pole, and wherein the magnetic sensor is configured to generate the sensor signal in response to the north pole or the south pole of the magnet being aligned with at least a portion of the magnetic sensor.

15. The ingress protected electronic device of claim 12, wherein the ingress protected electronic device is a medicine delivery device.

16. The ingress protected electronic device of claim 12, wherein the spring has a first end and an opposite second end, wherein the first end is coupled to the magnet and the second end is coupled to the ingress-protected housing outside of the ingress-protected enclosure, and wherein the actuation of the button causes the second end to apply a force in a first direction on the ingress-protected housing and the first end to move in a second direction opposite to the first direction.

17. The ingress protected electronic device of claim 12, wherein the spring and the magnet are disposed within a recessed portion defined the ingress-protected housing.

18. The ingress protected electronic device of claim 17, wherein the button is configured to be depressed into the recessed portion.

19. The ingress protected electronic device of claim 12, wherein the spring is configured such that a restoring force of the spring returns the spring to the unstressed configuration to move the magnet out of proximity of the magnetic sensor.

20. An ingress-protected electronic device, comprising:

an ingress-protected housing defining an ingress-protected enclosure;

a Hall Effect sensor disposed within the ingress-protected enclosure; and an ingress-tolerant switch assembly disposed outside of the ingress-protected enclosure and configured to cause performance of a function of the electronic device, the switch assembly including:

a button;

a spring operably coupled to the button, the spring configured to transition between an unstressed configuration and a stressed configuration in response to an actuation of the button; and a magnet coupled to the spring and configured to move relative to the Hall Effect sensor in response to transition of the spring between the unstressed configuration and the stressed configuration caused by the actuation of the button, wherein:

the button is configured to, in response to a pressing force acting on the button, overcome a spring force of the spring to transition the spring from the unstressed configuration to the stressed configuration to move the magnet into proximity of the Hall Effect sensor to cause the Hall Effect sensor to generate a sensor signal for performing a function of the electronic device; and the spring is configured such that a restoring force of the spring returns the spring to the unstressed configuration upon removal of the pressing force acting on the button to move the magnet out of proximity of the Hall Effect sensor.

* * * * *